(12) United States Patent
Schofield, III et al.

(10) Patent No.: US 7,616,004 B1
(45) Date of Patent: Nov. 10, 2009

(54) BACKPLANE TESTER AND METHOD OF USE

(75) Inventors: John Paul Schofield, III, Washington, IN (US); Dennis George Jones, Bloomington, IN (US); Mark G. Taylor, North Huntingdon, PA (US); Leonard J. Mayotte, White Oak, PA (US)

(73) Assignee: The United States of America as represented by the Department of the Navy, Washington, DC (US)

( * ) Notice: Subject to any disclaimer, the term of this patent is extended or adjusted under 35 U.S.C. 154(b) by 368 days.

(21) Appl. No.: 10/975,126

(22) Filed: Oct. 25, 2004

(51) Int. Cl.
*G01R 31/08* (2006.01)
*G01R 31/02* (2006.01)

(52) U.S. Cl. ................................ 324/522; 324/537

(58) Field of Classification Search ............... 324/538, 324/522, 537
See application file for complete search history.

(56) References Cited

U.S. PATENT DOCUMENTS

| | | | | |
|---|---|---|---|---|
| 5,841,788 A | * | 11/1998 | Ke | 714/726 |
| 6,194,908 B1 | * | 2/2001 | Wheel et al. | 324/761 |
| 6,956,379 B2 | * | 10/2005 | Mastoris et al. | 324/538 |

\* cited by examiner

*Primary Examiner*—Amy He
(74) *Attorney, Agent, or Firm*—John Gladstone Mills; Timothy Slabouz; U.S. Navy-NAVAIR Naval Air Sys Command

(57) ABSTRACT

The present invention can be generally described as a backplane test device that provides the possible flexibility of being operationally resident on a standard card form factor, and thereby, potentially able to provide a testing capability that does not require the use of hardware or software not residing on the card form factor. Moveover, since the test device may be operationally inserted into a backplane, the present invention may be effectively used in a variety of environments including, but not limited to, those constrained by space considerations, and/or to those that are subject to vibrations due to their operational nature. This may provide a technician with greater flexibility, and could possibly allow a backplane to be tested, and possibly repaired, while the platform is operational.

15 Claims, 4 Drawing Sheets

FIG. 4

| Pin Number | Row Z Signal Mnemonics | Row A Signal Mnemonics | Row B Signal Mnemonics | Row C Signal Mnemonics | Row D Signal Mnemonics |
|---|---|---|---|---|---|
| 1 | MPR | D00 | BBSY* | D08 | VPC |
| 2 |  | D01 | BCLR* | D09 |  |
| 3 | MCLK | D02 | ACFAIL* | D10 | +V1 |
| 4 |  | D03 | BG0IN* | D11 | +V2 |
| 5 | MSD | D04 | BG0OUT* | D12 | RsvU |
| 6 |  | D05 | BG1IN* | D13 | -V1 |
| 7 | MMD | D06 | BG1OUT* | D14 | -V2 |
| 8 |  | D07 | BG2IN* | D15 | RsvU |
| 9 | MCTL |  | BG2OUT* |  | GAP* |
| 10 |  | SYSCLK | BG3IN* | SYSFAIL* | GA0* |
| 11 | RESP* |  | BG3OUT* | BERR* | GA1* |
| 12 |  | DS1 | BR0* | SYSRESET* | 3.3V |
| 13 | Rsvbus | DS0 | BR1* | LWORD* | GA2* |
| 14 |  | WRITE* | BR2* | AM5 | 3.3V |
| 15 | Rsvbus |  | BR3* | A23 | GA3* |
| 16 |  | DTACK* | AM0 | A22 | 3.3V |
| 17 | Rsvbus |  | AM1 | A21 | GA4* |
| 18 |  | AS* | AM2 | A20 | 3.3V |
| 19 | Rsvbus |  | AM3 | A19 | Rsvbus |
| 20 |  | IACK* |  | A18 | 3.3V |
| 21 | Rsvbus | IACKIN* | SERA | A17 | Rsvbus |
| 22 |  | IACKOUT* | SERB | A16 | 3.3V |
| 23 | Rsvbus | AM4 |  | A15 | Rsvbus |
| 24 |  | A07 | IRQ7 | A14 | 3.3V |
| 25 | Rsvbus | A06 | IRQ6 | A13 | Rsvbus |
| 26 |  | A05 | IRQ5 | A12 | 3.3V |
| 27 | Rsvbus | A04 | IRQ4 | A11 | LI/I |
| 28 |  | A03 | IRQ3 | A10 | 3.3V |
| 29 | Rsvbus | A02 | IRQ2 | A09 | LI/O |
| 30 |  | A01 | IRQ1 | A08 | 3.3V |
| 31 | Rsvbus | -12V | 5VSTDBY | 12V |  |
| 32 |  | 5V | 5V | 5V | VPC |

BACKPLANE TESTER AND METHOD OF USE

STATEMENT REGARDING FEDERALLY SPONSORED RESEARCH OR DEVELOPMENT

The invention described herein may be manufactured and used by or for the Government of the United States of America for governmental purposes without payment of any royalties thereon or therefor.

CROSS REFERENCE TO RELATED APPLICATIONS

Not Applicable.

REFERENCE TO A SEQUENCE LISTING, A TABLE, OR A COMPUTER PROGRAM LISTING COMPACT DISK APPENDIX

Not Applicable.

BACKGROUND OF THE INVENTION

The present invention generally relates to instruments that are capable of determining the status of various parameters and/or characteristics associated with electronic and/or electrical equipment, and more particularly, but without limitation, to instruments capable of testing the operational and/or functional parameters and/or characteristics of backplanes.

Generally described, a backplane is an electronic circuit board containing circuitry and/or slots (or sockets) into which additional electronic devices (normally found on other circuit boards or cards) can be interconnected. Functionally, the backplane operates as an interface between these devices and the other parts of a "system" (which may include as an example, but not as a limitation, the system's data and power distribution buses, as well as the backplane and the devices associated with the backplane).

Since the backplane provides the physical and electrical connections between the various system components, the backplane allows the system and its related components to electrically and/or electronically communicate. Therefore, it is highly desirable to ensure that the backplane is operating within its prescribed parameters and, if it is not, to also be able to quickly and effectively perform fault-analysis in order to return the system to service or to effectuate repairs when appropriate. And, while test systems that offer means for testing backplanes are currently available in the marketplace, many of these generally require the use of a personal computer (PC) or some other add-on to provide external processing capability. In this regard, while a PC-based configuration may provide a user with a wide variety of testing alternatives, many of these features may be unnecessary and, as a result, not needed in many testing environments. Furthermore, many of these test systems are also encumbered by other features and add-ons, which may also act as constraints to the test system, and which may further cause these test systems to be extremely complex to use, cumbersome, and/or costly. Therefore, a need remains for a low-cost, yet robust, backplane test system that is compact, easy-to-use, and relatively simple to manufacture.

BRIEF SUMMARY OF THE INVENTION

According to its major aspects and briefly recited, the present invention relates generally, but without limitation, to devices for testing backplanes including, but not limited to, VERSAmodule Eurocard (VME) type backplanes.

Generally, as an example but not as a limitation, the backplane tester (BT) may be comprised of readily available and well-known electronic (and/or electrical) components (and/or devices) that may be embedded (or reside) on (or are otherwise connected or attached to) a base element. The base element would be selected so that the BT could easily interface with and/or test the device it is designed for, and for example, but not as a limitation, the base element could be a VME-type "card form factor," which, in at least this case, would allow the BT to be easily inserted into a VME-type backplane. Moreover, the components and/or devices would be selected so that the BT may be provided with the capability of performing a wide variety of electronic and/or electrical tests on the backplane or other device that it is designed to test.

In this regard, and more specifically with respect to backplanes as an example, since it is well known that a backplane's mechanical interconnects and exposed pins (as well as each power supply associated with a backplane) are frequent causes of backplane problems, the BT is preferably designed to test for conditions attributable to these causes of (backplane) failures. Such tests may include, but are not limited to: a test for determining the possible existence of a "short-circuit;" a "high-voltage test;" a "supply voltages test;" an "impedance test;" and/or an "open-circuits" test. Moreover, Applicants believe that testing for proper power supply voltages, intrusive voltages, and shorts between bussed signals, can be reasonable and effective methods for detecting the most common failures caused by shorted pins (which, generally, may have been bent during manual insertion of a circuit card or by faults in the rear panel transition connectors). As an example, but without limitation, the following "system" scenario demonstrates the BT's potential ability to test a backplane that has encountered an intrusive voltage through a bent pin. First, the BT could run a test to detect an intrusive voltage, which, for convenience, will be referred herein as an "intrusive voltage test." This test could be used to detect the existence of an intrusive voltage, identify the pins at fault, and then terminate the testing process, if desired. Afterwards, once the source of the intrusive voltage is eliminated (e.g., a repair effectuated), testing could be resumed. Additionally, it should be noted that an intrusive voltage often causes transmission line damage, and, because of this, the BT could be designed to use other tests to detect, and possibly aid in isolating, this damage. More specifically, a "short test" could be used to possibly detect the following: pins that have shorted together due to corrosion; pins that have become bent during card insertion or rear transition insertion; and traces that have fused together due to excessive current. Furthermore, an "open test" possibly could be used to detect a line that has been severed due to excessive current, and to detect pin damage in the bus interconnects (J1 and J2), which may occur due to misaligned pins on a circuit card. However, to detect damage to a bus interconnect may require that the BT be placed in (or interfaced with) the location that is suspected of being damaged (e.g., a damaged backplane slot). Finally, an "impedance test" possibly could be used to detect a partial loss of connectivity due to excessive current or pin corrosion. An "impedance test" could be designed to verify proper termination resistance(s), and it possibly can be used to verify that any measured transmission line resistance does not exceed a specified value. (See ANSI/VITA 1-1994 FIGS. 6-2, for example.) Moreover, an "impedance test" does not have to be designed to measure transmission line impedance—though this feature could be incorporated into an embodiment of the BT.

A feature of the BT is that it may use standard card forms and other readily available components; however, it is not limited to these standard forms or components. An advantage of this is that the BT could have the flexibility to not only be configurable to standard sizes and shapes for use with a variety of backplanes (or other devices) already on the market, but it also may have the flexibility to be easily configured to other standards and/or to use other components as they are developed.

Another advantage of using standard card forms (as well as other components for other appropriate configurations) is that it allows the BT to become a temporary, yet self-contained and compact, part of the backplane (or with the other devices with which it can be used).

It is a further feature of the present invention to be functionally and operationally simple to use, yet be highly durable and reliable.

Another feature of the present invention is that it could be effectively used in a variety of environments including, but not limited to, those constrained by space considerations, and/or those subject to vibrations due to the nature of the platform in which the backplane (or other device) is being used, e.g., on aircraft or non-aircraft vehicles. One advantage of this feature of the BT is that it provides a technician (and the platform) with greater flexibility, and possibly provides the user with the ability to have a backplane (or other device) tested and repaired while the platform is operational. As a non-limiting example of this, the BT possibly allows a technician to perform corrective or preventative maintenance on a backplane while it is being used on an operational ship or aircraft.

Other features and their advantages will be apparent to those skilled in the art from a careful reading of the Detailed Description of the Invention, accompanied by the drawings.

BRIEF DESCRIPTION OF THE SEVERAL
VIEWS OF THE DRAWINGS

FIG. 4 is an example of the signals that may be monitored by the backplane tester and the associated pin assignments according to a preferred embodiment of the present invention.

DETAILED DESCRIPTION OF THE INVENTION

The use of the term "ANSI" is an acronym for the American National Standard Institute, "VITA" is an acronym for the VMEBus Industry Trade Association, and, as previously mentioned, VME is an acronym for VERSAmodule Eurocard, which is also a well-known standard in the art. Since the present invention Backplane Tester (BT) can be implemented as a "card" made to ANSI-VITA standards, it could be insertable into a slot on a backplane (or "rack") that is also made to ANSI-VITA standards—such as a VMEbus backplane. However, while this implementation may be one of the embodiments of the present invention, it does not limit the present invention from being implemented (and/or configured) in a myriad of other manners within the spirit and scope of this Application. Moreover, while the devices, circuits, and/or other components used in the present invention preferably come from a group of devices, circuits, and/or other components that are well known and/or are commonly available to (or may be fabricated using commonly available knowledge, methods, and/or technology in) the field(s) of electronics, electrical test circuitry or equipment design, and/or to other related fields, other means of implementing the present invention may also be used as well. As a non-limiting example, a FPGA, Field Programmable Gate Array, (or some other "system on a chip") may be used to provide most, if not all, of the processing requirements for the present invention.

Figure 1:
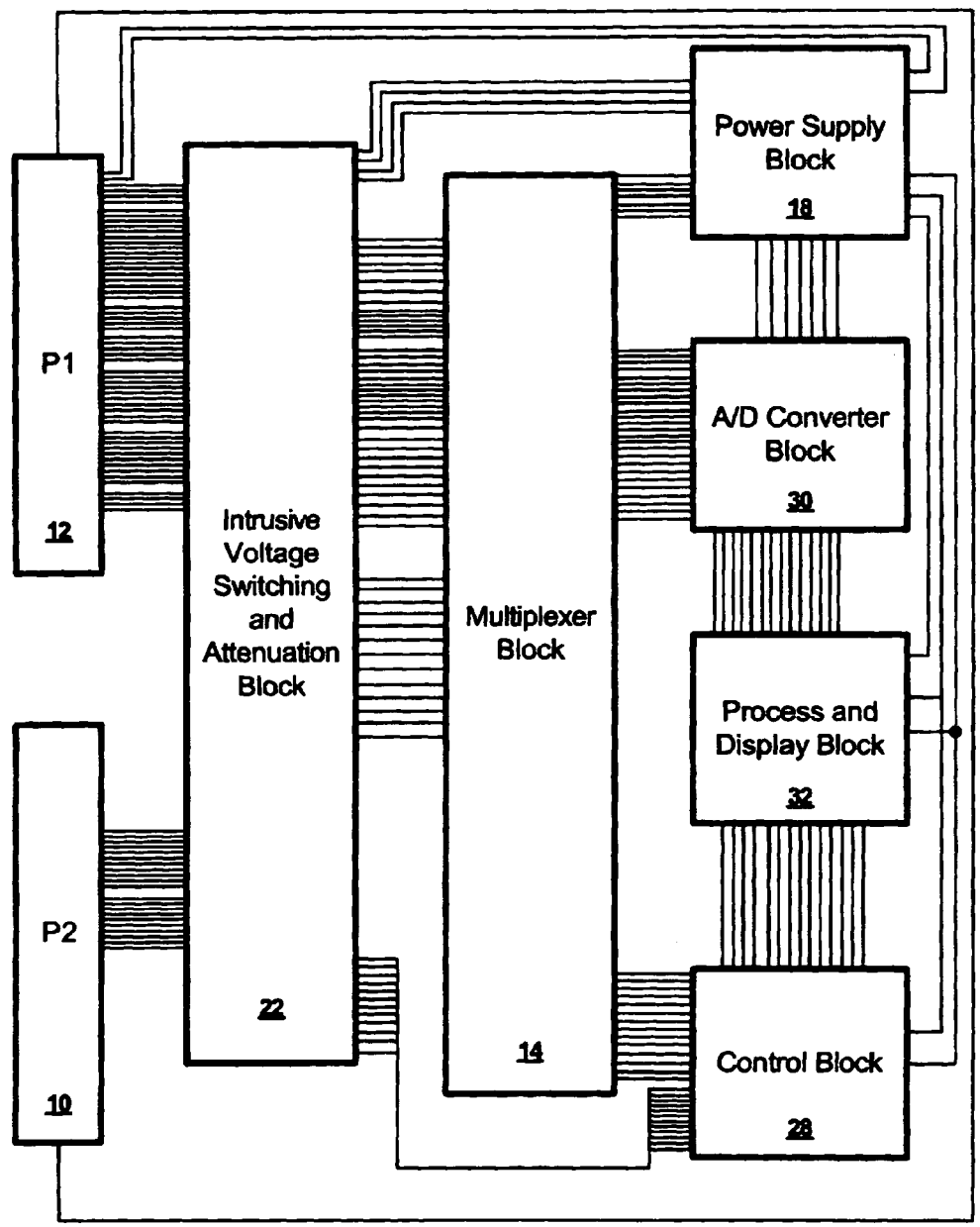
FIG. 1 is a schematic block diagram of a backplane tester according to a preferred embodiment of the present invention.
Figure 3:
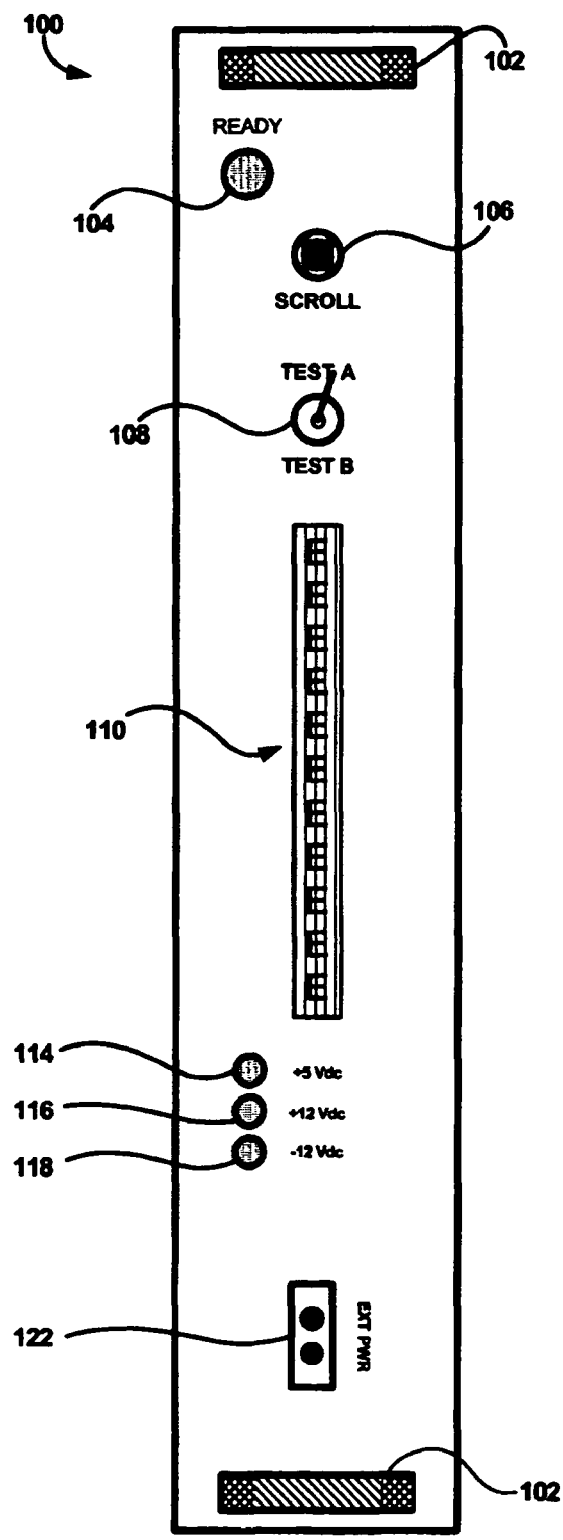
FIG. 3 is an example of a front plan view of a backplane tester in accordance with the principles of the present invention.

Referring now to FIG. 1, a schematic block diagram of an embodiment of the present invention Backplane Tester (BT) 1 is shown, which, as previously discussed, may be implemented in accordance with well-known ANSI-VITA standards using well-known electrical and/or electronic circuits represented by the BT 1 blocks discussed below. However, the BT 1 should not be considered to be limited by such standards and may be implemented using other standards (or specifications) as appropriate. Preferably, the components used in realizing the features of FIG. 1 are connected to a "standard" card form factor, e.g., a card form factor meeting ANSI-VITA standards. For example, but not as a limitation, the BT 1 can be designed in accordance with the well-known ANSI-VITA 1-1994 standard as a 6U X 1 slot VME card (not shown) that uses standard 160 pin VME64x (ANSI-VITA 1.1-1997) P1 12 and P2 10 connectors, and, as shown in FIG. 3, has VME64x injector/extractor handles 102. Generally, the BT 1 can have, but it is not limited to, a card depth of 160 mm or 220 mm; however, if the 220 mm card depth option is used in a 160 mm "rack," one or more embodiments of the BT 1 may be designed to have a "vacant area." As an example, but not as a limitation, the location of this "vacant area" can be at a depth of between about 155 mm to about 165 mm to possibly ensure that the BT 1 is not shorted by a neighboring circuit card's front panel, and/or by another component or device. Moreover, an embodiment of the BT 1 having a card depth of 160 mm may be usable in a 220 mm "rack" by using a "standard" 60 mm extension card. Furthermore, a 220 mm embodiment of the BT 1 could be designed to permit cooling of its active components for use within a 160 mm "rack" by placing these components in an area that could be considered typical for components placed on a standard 160 mm card. By doing this, the capability of the BT 1 to be interchangeably used with either a 160 mm or a 220 mm "rack" may be further enhanced.

Again referring to the BT 1 block diagram shown in FIG. 1, the BT 1 can be generally described by the following discussion. The P2 10 and P1 12 blocks represent the plugs used to provide a "standard" connection (or interface) between the BT 1 and the backplane (or other device) into which the BT 1 is inserted. By providing this interface, P2 10 and P1 12 allow the Multiplexer Block 14 and/or the Control Block 28 to control the signal processing of the backplane's (or other device's) signal lines, and allow the Power Supply Block 18, the Intrusive Voltage Switching and Attenuation Block 22, the A/D (analog-to-digital) Converter Block 30, and the Process and Display Block 32, to provide their later-described functions. Regarding the other blocks shown in FIG. 1, the Power Supply Block 18 regulates, supplies, and/or distributes power to the BT 1; thereby permitting the BT 1 to operate and possibly provide protection from poorly regulated backplane power sources. Moreover, the Power Supply Block 18 may be used to monitor and/or test the backplane voltages, and provide a display of the results through LED's 114, 116, and/or 118 (as shown on FIG. 3). Preferably, the Intrusive Voltage Switching and Attenuation Block 22 provides circuit protection from high voltages, attenuates these signals to a level that can be processed and/or measured by the A/D Converter Block 30, and switches the appropriate signal(s) into the Multiplexer Block 14. Preferably, the Multiplexer Block 14 then switches the appropriate signal(s) for testing purposes— either to the A/D converter Block 30 for measurement, or from the Control Block 28 to the backplane for stimulus. Additionally, the A/D Converter Block 30 measures the analog signal(s) being passed in from the backplane and passes a digital representation of such signal(s) to the Process and Display Block 32.

Figure 2:
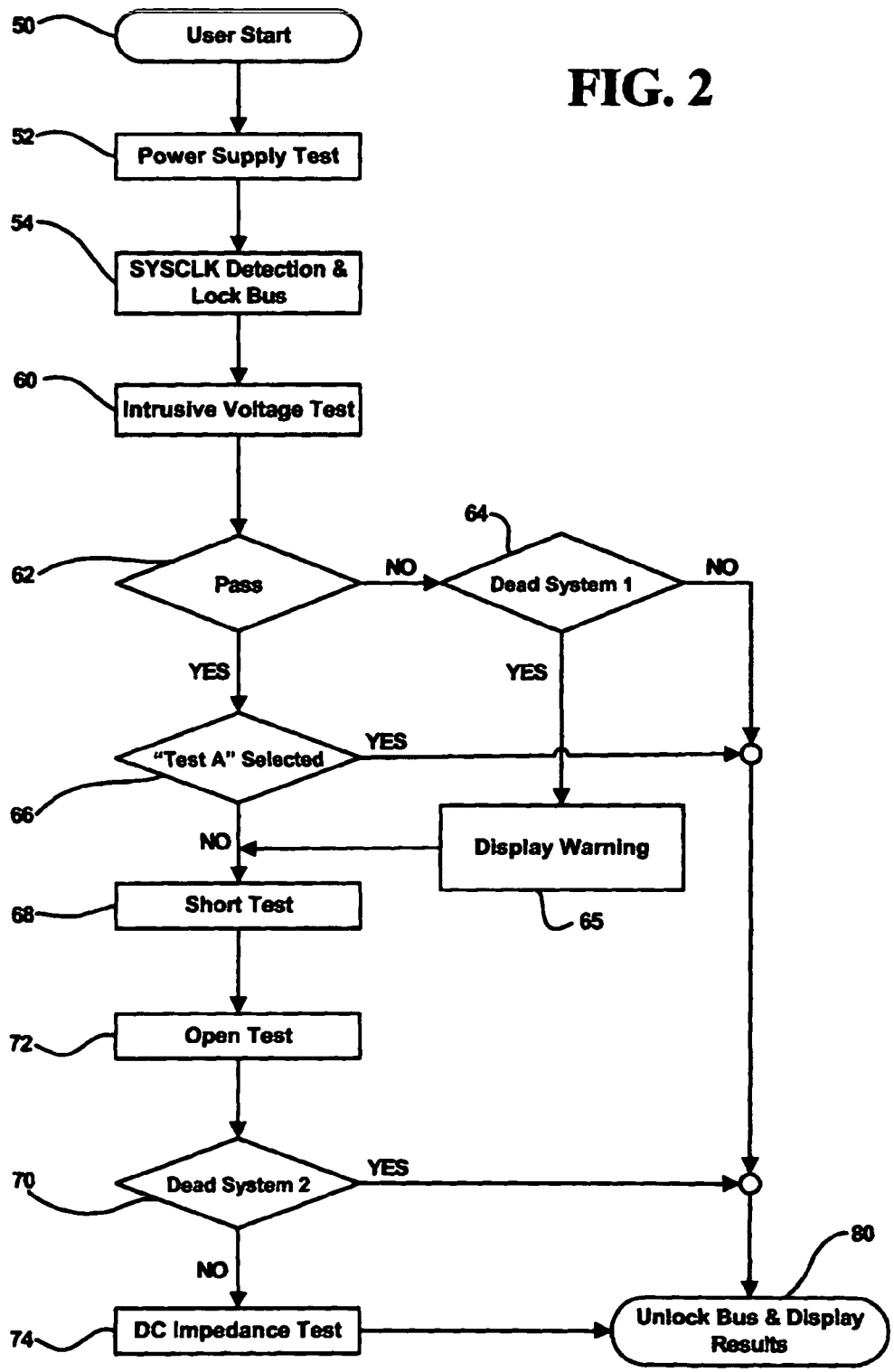
FIG. 2 is a flow chart illustrating a method for testing a backplane in accordance with the principles of the present invention.

The Process and Display Block 32 may process the data for each test performed by the BT 1. These tests may include, but are not limited to, the following (as shown in FIG. 2): the Power Supply Test 52, which may check for voltages on the backplane; the Intrusive Voltage Test 60, which may be used to determine if detected voltages are outside of a "normal operating range;" the Short Test 68, which may be used to test and/or monitor the backplane for short circuit conditions; the Open Test 72, which may be used to check that all terminations are operating properly; and/or the DC Impedance Test 74, which may test that no extra resistance is located in the transmission lines of the backplane, or that no partial short-to-ground is occurring. After processing the data (or other information gathered), the Process and Display Block 32 holds the information in storage until the data can be displayed on the Display 110 (shown on FIG. 3). And, besides displaying test results, the Process and Display Block 32 could possibly be used to provide the user with operational guidance regarding the status of the BT 1 (and 100, as shown in FIG. 3) as well as indications of the status of the backplane under test.

In a testing environment, intrusive (or relatively high) voltages, vibrations, and/or other similar conditions could be encountered by the BT 1 and 100; therefore, the components used in the BT 1 and 100 are preferably designed to withstand these voltages and/or other conditions to ensure survivability of the present invention. As an example, but not as a limitation, one or more embodiments of the BT 1 and 100 can be designed to effectively divert these voltages by providing a ground path. Furthermore, the BT 1 and 100 could be designed to operate under various ranges of ambient temperature conditions. Moreover, (while specifically referring to FIG. 3), another operating/design characteristic of the BT 100 preferably includes the use of a minimum user-interface and, in at least one embodiment, provides at least a part of this by using a pushbutton-type Display Scroll Down Switch 106, and a toggle-type Test Selection Switch 108. Both of these switches (as well as any other switch that may be used) are preferably of the type that is commonly found and used throughout the electrical and/or electronic field. It should be noted, however, that while these are preferable methods of implementing at least a portion of a user-interface, it should be understood that any other appropriate user-interface method including, but not limited to, other types of switches, or an infra-red transmitter (e.g., remote control device), could be used as well. Moreover, by designing the BT 1 and 100 with a preferably minimal user-interface, the BT 1 and 100 may eliminate the need to use external communication or processing devices such as a portable computer, thereby eliminating the constraints of having to provide and having the space to use bulky external equipment. Alternatively, however, other embodiments of the BT 1 and 100 may be configured to interface with such devices.

In at least one embodiment of the BT 1 and 100, the functions of the Control Block 28 may be provided by at least one FPGA (Field Programmable Gate Array) or other appropriate component, such as an ASIC, Micro-Controller, or PSOC (programmable "system on a chip"), but other components, devices, and/or circuits also could be used. Furthermore, in an embodiment of the BT 1 and 100, provisions could be provided that may allow the FPGA (or any other component, device, and/or circuit that may be used) to be upgraded, for example, but not as a limitation, at least one socketed EPROM (not shown) could be used. Moreover, an interface (not shown) may be incorporated into the BT 1 and 100, which could be used for upgrades, developmental, testing, or other purposes and, as a non-limiting example a JTAG interface may be used.

Operationally, if the BT 1 and 100 is used with other cards in a rack, such as, but not limited to, a VME rack, the FPGA (or other component, device, and/or circuit) used in the Control Block 28 may have to either arbitrate or completely lock the backplane bus (or other device being tested), and, possibly have to do this, for the entire testing period. As a non-limiting example, if the BT 1 and 100 is arbitrating for the bus being tested, then the BT 1 and 100 should ensure that ownership (i.e., control) of the bus is kept by the BT 1 and 100 for the entire duration of the test. In at least one embodiment, this may be accomplished by having the BT 1 and 100 ensure that the BBSY* (the bus busy signal) is not deasserted during testing, which should prevent the release of the bus until testing has been completed. Moreover, during testing, the BT 1 and 100 may need to stimulate a live bus, and because other cards may be involved (which may provide a signal in response to a test being performed) inaccurate results may occur. To ameliorate this possibility, the BT 1 and 100 could be designed to "own" the bus during its testing process to ensure that the signal lines are not inadvertently stimulated. As an example, but not as a limitation, of how to accomplish this, reserved AM codes may be used while checking for shorts (i.e., VME circuit cards are not permitted to respond while a reserved AM code is broadcast on a backplane). Moreover, the BT 1 and 100 could be designed to share the bus with other cards and/or components (i.e., control of the bus is transferred between cards, etc.), and then perform tests only while it has possession of the bus. Another possible issue for consideration is the use of a "watchdog timer" by the bus being tested, which could force a timeout by generating a BERR*, a SYSFAIL*, and/or a SYSRESET* signal during testing. As an example, if provisions are not made to bypass the "watchdog timer," such a timeout could occur if the BT 1 and 100 did not release, re-arbitrate, and regain control of the bus during testing. Therefore, the BT 1 and 100 may be designed to use commonly known methods to compensate for the use of a "watchdog timer," it could be designed to limit possession of the bus to no longer than the minimum time-out period, and/or, by monitoring for other bus activity, it may controllably permit other Masters (i.e., bus users) to obtain use of the bus. Furthermore, since it is possible that other interrupt signals can be driven during testing, the BT 1 and 100 may be designed to possibly eliminate the testing of (and/or interference by) these signals as well. For example, the BT 1 and 100 may be designed to drive SYSRESET* low for most, if not all, of the time needed for testing, which may allow the BT 1 and 100 to lock (i.e., control) the bus during testing. This, in turn, may allow the BT 1 and 100 to be used to generate and/or monitor interrupt signals (including, but not limited to, IRQ*1-7, ACFAIL*, SYSFAIL*, and SYSRESET*) during testing and, therefore, be able to possibly provide a "full-testing" capability.

Referring again to FIG. 3, the Display 110 could be comprised of a digital display assembly that may combine the use of at least one LED indicator and/or at least one LCD display (or indicator) to provide information to the user. The Display 110 may be able to show any number of characters, and, in at least one embodiment, displays no less than 12 characters. The information that may be provided by the Display 110 will preferably include, but is not limited to, an indication verifying that the BT 100 and/or the backplane (or other device being tested) are operating within specification(s), e.g., an indication that the BT 100 has not locked-up may be shown. As another non-limiting example, the Display 110 could possibly provide the user with information through "text messages." Moreover, in at least one embodiment, an indication that the BT 100 is operating/running may be provided to the user through a blinking (or flashing) green LED 104. However, indications (and/or other form of information) are not limited to being provided by LEDs (whether or not they are blinking/flashing and/or green) and any other appropriate method (or combination of methods) could be used as well, including those that are audio-based, or are transmitted to an external display. Furthermore, if an LED is used, it could be of the type that has at least dual (or multiple) active states. As a non-limiting example, the blinking/flashing green LED 104 that was previously mentioned, could emit a "red" color in the event the BT 100 becomes locked-up, and/or the other LEDs 114, 116, and/or 118, which could also have multiple active states, may be used to provide other bits of information as well. For example, the LEDs, if used, can indicate "green" when voltages (and/or other monitored parameters) are within specification, "red" when voltages (and/or other monitored parameters) are outside of specification, and emit a third color (or not illuminate at all) whenever a voltage (and/or other monitored parameter's signal) is either not present or detected. As previously mentioned, the Display 110 could possibly provide information to the user through a form of "text messaging" (and/or some form of shorthand text). This information could include, but it is not limited to: a display of a geographical address to provide verification that the BT 100 is properly inserted into the backplane (e.g., a display of "RDY SLT 12" could be used for this). Also, a display that an "open test" fault has been detected (e.g., a display of "P2B23 OPN" could be used to describe the detection of an open fault on Pin 23, B row, of the P2 connector), and/or a display showing the magnitude of each monitored voltage. In general, the information that could be provided may be controlled by the needs of the user, and/or by the tests, functions, and/or features that the BT 1 and 100 is configured to provide. Furthermore, the information may be "immediately" available, and/or it may be stored, processed, and/or displayed for later uses. Moreover, the BT 1 and 100 could incorporate an information-scrolling feature in order to allow multiple information lines to be consecutively displayed. This feature may be implemented by using the Display Scroll-Down Switch 106; however, any other method could be used including, but not limited to, the use of a toggle switch, or internal timing circuits to continuously scroll the information.

To energize the BT 1 and 100, input power is provided by the means associated with the Power Supply Block 18 (shown on FIG. 1). Preferably, the source of power is provided by an energized backplane (or other device) that is being tested, and is established by inserting the BT 1 and 100 into the backplane (or other device). Alternatively, the BT 1 and 100 may be configured so that an external power source could also be used. This could preferably be implemented by using jumpers to connect such a source into the External Power Jacks 122 located on the front panel (shown on FIG. 3), and through the action of connecting the jumpers (or by the setting of a switch), power from the backplane may be deliberately bypassed and then fed through the front panel. These, however, are not the only methods that can be used to supply power to the BT 1 and 100, and other examples of energization or sources of power for the BT 1 and 100 include, but are not limited to, the use of DC power, which could possibly be supplied by internal batteries. Somewhat relatedly, a load for the BT 1 and 100 may be provided by circuit cards e.g., load cards that are inserted by the user or by the cards that are normally resident in the rack. However, these cards may be unavailable; therefore, at least one optional jumper (and/or at least one jumper setting) may be made available to add at least one load to the supplies (and/or to the other devices/components). Preferably, if one or more detachable jumpers are provided, one or more storage locations will be fabricated onto the BT 1 and 100 for jumper storage purposes when such jumpers are not in use. Furthermore, it will be preferable if each load card, jumper, and/or jumper setting could be capable of being used to perform power supply "load testing," if such testing is desired. Another, possible feature of the BT 1 and 100 is a "Hot Swap" capability. "Hot Swap," if implemented in the BT 1 and 100, would allow the BT 1 and 100 to be placed into a system (e.g., inserted into the backplane) without requiring the system to be de-energized. Implementation of "Hot Swap," if used, could be in accordance with ANSI/VITA 3-1995, which, in general, is the American National Standard for Board Level Live-Insertion for the VMEbus; however, other suitable standards may be used as well.

Referring now to FIGS. 1-3, the following description is an example, but not a limitation, of one of the possible operational uses of the present invention. In this example, the BT 1 and 100 will be used to perform the tests described below; however, the BT 1 and 100 should not be considered to be limited to only these tests—other tests may be designed into (or out of) the BT 1 and 100 to provide additional capabilities or to increase flexibility. Generally, the user may have the option of selecting one of two (or more) different "test sequences" (as shown in FIG. 2); however, a "single-test" embodiment may be available as well. These "test sequences," as well as the other features of the BT 1 and 100, can be implemented by using circuitry, devices and/or components that are well known to the field, and which are represented in FIGS. 1 and/or 3. Moreover, the BT 1 and 100 may be implemented by using other well-known circuitry (devices, components, and/or etc.) that are disclosed, shown and/or claimed herein, and/or by their equivalents. Consequently, for ease in understanding, the portions of the "test sequences" shown in FIG. 2 will be simply described, yet it should be understood by those familiar with the field of the invention that the implementation of the various portions of the "test sequences" are realized through these well known circuitry, devices, components, and/or by their equivalents. Furthermore, while the use of the BT 1 and 100 will be described in association with testing a backplane, it should be understood that the BT 1 and 100 could be configured to perform testing on other items of equipment (or components) other than backplanes.

More specifically, but not as a limitation, the User Start 50 operation (shown in FIG. 2) may consist of the following (user and/or automatic) actions being performed: making a visual inspection of the backplane to be tested; making a determination as to whether the backplane is energized (or "dead") by observing the card(s) inserted into the backplane and/or each cooling fan; preparing the BT 1 and 100 to use "backplane power" if the backplane is energized, or "external power" if it is not (or if the use of "external power" is desired); inserting (or connecting) the BT 1 and 100 into the backplane/system under test; verifying that power is available and the BT 1 and 100 is energized—preferably by noting that the "+5Vdc" indicator LED 114 is illuminated (and preferably appears green) and that the "Ready" indicator LED 104 is illuminated (preferably this indicator should appear red or a flashing green); verifying that the "Ready" indicator LED 104 continuously flashes green after about twenty seconds of flashing and that the backplane slot location (of the slot that the BT 1 and 100 has been inserted into or connected to) is being shown on the Display 110; and then selecting a desired test sequence (if more than one selection is available). As previously discussed, the BT 1 and 100 can be configured in a number of ways, and as an example, but not as a limitation, the BT 1 and 100 can be used to also monitor and/or test +3.3 Vdc power, and therefore, other circuits and at least one other LED may be added to the BT 1 and 100, as appropriate.

The first sequence of tests to be discussed, which may be performed in the order shown in FIG. 2, consists of the Power Supply Test 52 and the Intrusive Voltage Test 60. These particular tests are intended to protect components from over/under-voltage faults and, preferably, may be performed by the BT 1 and 100 in a relatively short period-of-time. The second sequence of tests may consist of the following tests (or some subset of these tests), which, if used, are preferably performed in the following order: the Power Supply Test 52; the Intrusive Voltage Test 60; the Short Test 68; the Open Test 72; and the DC Impedance Test 74. The BT 1 and 100 (shown in FIGS. 1 and 3 respectively) is preferably capable of performing this (or any other) sequence of tests within a relatively short period-of-time as well. Finally, after a test sequence has concluded, information regarding any detected faults/failures (and possibly other useful information) may be available to the user via the Display 110 (as shown on FIG. 3).

There are a variety of ways of labeling different "test sequences." For example, "Test A" can be used to designate a test sequence consisting of the Power Supply Test 52 and the Intrusive Voltage Test 60. Likewise, "Test B" can be used to designate a test sequence consisting of the Power Supply Test 52; the Intrusive Voltage Test 60; the Short Test 68; the Open Test 72; and the DC Impedance Test 74. Selecting a "test sequence" can be implemented in a variety of ways as well. For example, but not as a limitation, the Test Selection Switch 108 (shown in FIG. 3) can be toggled to (or positioned in) the "up" position to select "Test A" while toggling the Test Selection Switch 108 to (or positioning it in) the "down" position could be used to select "Test B." Moreover, the BT 1 and 100 can be configured to perform a "Dead System" test sequence consisting of the Power Supply Test 52, the Intrusive Voltage Test 60, and the Short Test 68, which may automatically be performed after connecting the BT 1 and 100 to a de-energized backplane/system under test. In at least one embodiment of the BT 1 and 100, the "Dead System" test sequence preferably requires a specific interface configuration, and as an example, but not as a limitation, "Test B" may be required to be selected. Following User Start 50, the other operations or functions shown in FIG. 2 (as implemented by the Blocks, circuitry and/or components represented in FIGS. 1 and/or 3) can be generally described by the following discussion of a non-limiting example of a preferred embodiment of the present invention as it is being used to test a backplane.

Referring to FIGS. 1-3, the Power Supply Test 52 (shown in FIG. 2) is the first test in a "test sequence" following User Start 50, and it may be generally implemented by, but is not limited in such implementation to, at least some portion of the Power Supply Block 18 (shown in FIG. 1). This Test 52 and (the associated circuitry, components and/or devices represented by this) Block 18 may be used to continually monitor the backplane under test for proper voltages, and to illuminate the power supply verification indicator LEDs 114, 116, and/or 118, and the Ready indicator LED 104 (shown in FIG. 3), when appropriate. Preferably, the Power Supply Test 52, and (the associated circuitry, components and/or devices represented by) the Power Supply Block 18, the Control Block 28, and/or the Process and Display Block 32 store and/or assist in displaying within-specification and/or out-of-specification voltages (and/or other information) on the Display 110. Moreover, there may be a message on the Display 110 to indicate that the Power Supply Test 52 is running. Next, the SYSCLK Detection and Lock Bus 54 function is primarily implemented by, but not limited in such implementation to, at least some portion of the circuitry, components and/or devices represented by the Control Block 28, the Multiplexer Block 14 and/or the Intrusive Voltage Switching and Attenuation Block 22. This Block 54 preferably checks for SYSCLK and highs on SYSRESET and SYSFAIL. If SYSCLK is present then LOCK BUS is activated, and BCLR* will not be tested, otherwise LOCK BUS is activated and BCLR* is tested. The Intrusive Voltage Test 60 (as primarily implemented by, but not limited in such implementation to, the circuitry, components and/or devices represented by the Intrusive Voltage Switching and Attenuation Block 22) may be performed next. Generally, the Intrusive Voltage Test 60 may be used to perform a voltage test on some portion of all of the backplane's signal lines that are being monitored. (See FIG. 4 for an example of the signals and/or pins being monitored and/or tested, and/or the J1/P1 Pin Assignments 200.) Preferably, an indication that the Intrusive Voltage Test 60 is starting may be shown to the user (e.g., "VOLT TST RUN" may be provided on the Display 110). Furthermore, indications of out-of-specification voltages that are detected and/or processed by the Intrusive Voltage Test 60 are preferably provided through the Unlock Bus & Display Results function 80. In implementation, this may require the Intrusive Voltage Test 60, the Intrusive Voltage Switching and Attenuation Block 22, the Control Block 28, and/or the Process and Display Block 32, to process, store, and/or transmit signals for use in providing this and/or other information via the Display 110.

Next, a determination is preferably made as to whether the backplane/system passed the Power Supply Test 52 and the Intrusive Voltage Test 60. This is represented by the "Pass" Decision Block 62 (shown in FIG. 2), which may be primarily implemented by, but is not limited in such implementation to, at least some portion of the circuitry, devices and/or other components represented in FIGS. 1 and/or 3, including, the Process and Display Block 32 shown in FIG. 1. Referring back to FIG. 2, if a fault is detected by either the Power Supply Test 52 or the Intrusive Voltage Test 60, the BT 1 and 100 makes a determination as to whether the backplane/system is de-energized and "Test B" is selected (as represented by the Dead System 1 decision block 64), and (as represented by Block 65) a warning on the Display 110 is provided to the user to verify that "system" power and the appropriate cards have been removed and that "Test B" is selected. Preferably, this Dead System 1 64 decision is primarily implemented by, but is not limited in such implementation to, the Control Block 28 shown in FIG. 1. If the backplane/system is de-energized and if "Test B" is selected (i.e., a "yes" or a positive result), the Short Test 68 is preferably performed next followed by the Open Test 72. Otherwise, including the case in which no fault is detected by either Test 52 or 60 and "Test A" is selected (as shown in FIG. 2), indications of the test results from the Power Supply Test 52 and/or the Intrusive Voltage Test 60 (and/or their respective associated Blocks 18 and/or 22) are provided through the Unlock Bus & Display Results function 80 (and the associated Process and Display Block 28). In implementation, this may require the Power Supply Test 52, the Power Supply Block 18, the Intrusive Voltage Test 60, the Control Block 28, and/or the Process and Display Block 32, to process, store, and/or transmit signals for use in providing this and/or other information via the Display 110. Except for the attenuation portion of the Intrusive Voltage Switch and Attenuation Block 22, some portion of all of the Blocks shown in FIG. 1 may be used to implement the Short Test 68, and an indication will be preferably shown on the Display 110 to indicate that the Short Test 68 is starting (e.g., "Shrt Tst Run" may be provided). Furthermore, after the Short Test 68 is performed, indications of the faults that are detected and/or processed by the Short Test 68 (and/or the Process and Display Block 32) may be provided to the user through the Unlock Bus & Display Results function 80 (which, in implementation, may require the Short Test 68, the Control Block 28, and/or the Process and Display Block 32, to process, store, and/or transmit signals for use in providing this and/or other information via the Display 110).

Continuing with FIG. 2, another determination may be made as to the energization status of the backplane/system as represented by the Dead System 2 decision block 70 shown in FIG. 2. This Dead System 2 decision block 70 may be primarily implemented by, but it is not limited in such implementation to, the Control Block 28 and the Process and Display Block 32 shown in FIG. 1. Next, the "Test B" test sequence may continue with the performance of the Open Test 72, and if the backplane/system is energized, the DC Impedance Test 74. Except for the attenuation portion of the Intrusive Voltage Switch and Attenuation Block 22, each of these Tests 72 and 74 may primarily be implemented by some portion of all of the Blocks shown in FIG. 1. Alternatively, if the backplane/system is determined to be de-energized, the test results from the Power Supply Test 52, the Intrusive Voltage Test 60, the Short Test 68, and the Open Test 72, may be provided to the user via the Unlock Bus & Display Results function 80 (which, in implementation, may require signals processed by the Tests 52, 60, 68 and/or 72 (and/or the A/D Converter Block 30) to be primarily transmitted to (and/or processed by) the Control Block 28, the Process and Display Block 32 and/or the Display 110 (as shown in FIGS. 1 and 3).

Preferably, the Open Test 72 (which may be implemented by using some portion of all of the Blocks, except for the attenuation portion of the Intrusive Voltage Switch and Attenuation Block 22, shown in FIG. 1) provides both an indication to the user that the Open Test 72 is starting (e.g., "Open Tst Run") and possibly other information regarding the faults and/or failures that have been detected and/or processed by the Open Test 72. This is preferably accomplished via the Unlock Bus & Display Results function 80 (which, in implementation, may require signals from the Open Test 72 and/or the A/D Converter Block 30 to be primarily transmitted to (and processed by) the Control Block 28, the Process and Display Block 32, and/or the Display 110 (as shown in FIGS. 1 and 3). Similarly, the last test of the "Test B" sequence, as described in this non-limiting example of the present invention, is the DC Impedance Test 74. When performed, the DC Impedance Test 74 (as implemented by some portion of all of the Blocks, except for the attenuation portion of the Intrusive Voltage Switch and Attenuation Block 22, shown in FIG. 1) may provide an indication to the user that the DC Impedance Test 74 is starting (e.g., "Impd Tst Run"). Furthermore, the DC Impedance Test 74 may also provide other information regarding the faults and/or failures detected and/or processed by the DC Impedance Test 74 (and/or the Process and Display Block 32). This information is preferably provided via the Unlock Bus & Display Results function 80 (which, in implementation, may require signals from the DC Impedance Test 74 (and/or the A/D Converter Block 30) to be transmitted to (and/or processed by) the Control Block 28, the Process and Display Block 32, and/or the Display 110.

The terminus of the flowchart (as shown in FIG. 2) is the Unlock Bus & Display Results function 80. Preferably, the Unlock Bus & Display Results function 80 (which may be implemented by, but is not limited in such implementation to, the Process and Display Block 32, the Control Block 28, and/or the Display 110) unlocks the bus and provides the user with useful information including, but not limited to, the items of information previously discussed above. More specifically, the Unlock Bus & Display Results function 80 may be implemented by using any well-known data storage device for example, but not as a limitation, RAM memory could be incorporated in the Process and Display Block 32, the Control Block 28, and/or the Display 110 itself Furthermore, the information may be stored in a "queue," which may be based on the order in which the information is received and/or processed by the BT 1 and 100, and which may allow the information to be cycled (or consecutively displayed). Moreover, this cycling of information may be provided by the Display Scroll-Down Switch 106, or by incorporating a "scroll feature" into the Test Selection Switch 108 (shown in FIG. 3). Based on the configuration used, the "scroll feature" may be implemented by using any well-known hardware and/or software technique. Other possible features of the BT 1 and 100 may include the ability to provide delayed and/or remote transmissions (and/or displays) of the stored information. This may enable the BT 1 and 100 to provide the information via the Display 110 and/or an external viewer before and/or after the BT 1 and 100 has been removed from a tested backplane/system. Moreover, another embodiment of the BT 1 and 100 could possibly allow the information to be downloadable. As non-limiting examples, the information displayed for each of the indicated tests may use the following formats (as shown between the quotation marks):

Power Supply Test 52: "−12V=−11.45V" (can be used to indicate that the −12 Vdc test detected about −11.45 Vdc);

Intrusive Voltage Test 60: "P1B03 HI VLT" (can be used to indicate that a high voltage has been detected on Connector-P1, Row-B, Pin-03, and, alternatively, a low voltage can be indicated by a display of "LO VLT" vice "HI VLT");

Short Test 68: "P1A24 SHORT" (can be used to indicate that a short was detected on Connector-P1, Row-A, Pin-24);

Open Test 72: "P1B23OPEN" (this can be used to indicate that an open was detected on Connector-P1, Row-B, Pin-23);

DC Impedance Test 74: "P2B04 IMPED" (can be used to indicate an impedance fault has been detected on Connector-P2, Row-B, Pin-4); and other displays of information may include, but are not limited to, the following:

"TST COMPLTD": which may be used to indicate that the selected test sequence has completed, and possibly that the appropriate information has been displayed (and/or possibly recorded by the BT 1 and 100 for future display and/or transmission to an external device).

After the test sequence has completed, the user may be able to operationally continue using the BT 1 and 100 by cycling through the information—possibly by using the scroll feature of the Display Scroll-Down Switch 106. As non-limiting examples of other user actions, the user could select a different test, possibly by using the Test Selection switch 108, or otherwise reset the BT 1 and 100 in order to re-activate the originally selected test sequence. Additionally, the user may be able to select another test sequence, if available, in order to perform different tests, or the user could remove the BT 1 and 100 from the backplane/system. The operation of the Blocks as shown in FIG. 1 (and/or their associated tests/functions as shown in FIG. 2) may be more specifically described by the following discussion.

Power Supply Block 18: the Power Supply Block 18 (and/or the associated Power Supply Test 52) may be used to detect, measure, process, store and/or display—which may be singularly and/or collectively referred to herein as "monitor"—voltages and/or other electrically (and/or electronically) related parameters. The circuitry/hardware and/or software needed to perform the Power Supply Test 52 may be hard-wired and/or hardcoded, and/or a portion of it may be added later. Moreover, the BT 1 and 100 may be configured to sample, or to continuously monitor supply (and/or other) voltages, and/or other parameters, to ensure that they stay within specification while the BT 1 and 100 is energized and/or is being operationally used. Referring to FIG. 4, at least some of the following voltages may be monitored: +5V (VPC monitored with +5V); +12V; −12V; and/or +3.3V. These may not be the only voltages monitored, however, and, in at least one embodiment of the BT 1 and 100, monitoring of some voltages may be optionally provided—possibly by using at least one optional jumper, jumper setting, and/or programmable device. Optionally, the user may have the discretion to display all recorded measurements on the Display 110, or only those measurements that are out-of-specification. More specifically, one method that may be used to perform the Power Supply Test 52 (and/or the other tests described herein) would utilize at least one 12-bit Analog-to-Digital Converter (ADC), which could pass the digital information to at least one FPGA, some other "system on a chip," and/or some other suitable component, or digital controller (and/or any associated hardware and/or software) for processing. Moreover, it is well known in the field that the use of an FPGA (and/or its associated FPGA firmware), and, possibly, the use of a similar "system on a chip," and/or some other suitable component, or digital controller (and/or any associated hardware and/or software) may permit the user to adjust tolerances and/or specifications as desired and/or as necessary. However, other suitable, well-known alternatives for detecting, measuring, processing, and/or recording voltages (and/or other parameters) could be used as well, and as a non-limiting example zener-diode based circuits could be used as a method of measuring/detecting the status of voltages (e.g., to verify that the voltage levels are within specification). Moreover, as previously described, the BT 1 and 100 may display information on such measurements (and/or on other parameters) by using the LEDs 114, 116, and/or 118, the Display 110 (shown in FIG. 3), and/or by using some other suitable technology. In addition, the signaling of out-of-specification voltages and/or other parameters may be emphasized during operation of the BT 1 and 100 by, for example, an audio signal, which may accompany the use of multi-color LEDs (and/or other means of display). Moreover, as previously discussed, the BT 1 and 100 could use one or more LEDs that appear green (or any other first color) to indicate "within specification voltages," red (or any other second color) to indicate "outside of specification voltages," and/or appear as a third color (or appear de-energized) to indicate that an associated voltage is undetected. While the immediately preceding example of "how-to" display information may be used, any other appropriate method (or combination of methods) including, but not limited to, using one or more LCD and/or plasma display, and/or any other appropriate display technology (including the previously discussed LEDs) also could be used. As a further non-limiting example, if an "outside of specification voltage" is detected and/or is indicated by one or more of the LEDs 114, 116, and/or 118, the magnitude of the "outside of specification voltage" could be shown on the Display 110 as well. Moreover, other detected and/or measured voltages may also be displayed by the BT 1 and 100, including, but not limited to, the +/−V1 and +/−V2 voltages. Likewise, since a user's information requirements may be varied, the BT 1 and 100 may be configured (and/or configurable) to meet most, if not all, of these requirements. As an example, but not as a limitation, the BT 1 and 100 may only display voltages and/or other information upon the completion of testing, and/or it may limit displays to measured voltages (or other parameters) that exceed a set deviation from a specification value for the subject parameter. (As an example, the BT 1 and 100 could display a measured voltage having a deviation greater than +/−1 V from a set specification value.) While only displaying information associated with "out-of-specification" voltages may be preferred in some embodiments, other embodiments of the BT 1 and 100 may also display "within-specification" voltages as well. Furthermore, another possible feature of the BT 1 and 100 could be the automatic termination of a test sequence in the event the backplane/system fails the Power Supply Test 52. In such an event, further testing may be halted until the cause of the fault is repaired or an external power source is connected to the BT 1 and 100. Preferably, but without limiting the present invention, the following ANSI-VITA Rules, Tables, Figures and/or Specifications may be used in implementing the functions of the Power Supply Block 18:

Applicable Rules/Tables:
    Table 6-1 (ANSI-VITA 1-1994);
    Rule 3.18 (ANSI-VITA 1.1-1997); and
    Rule 3.27 (ANSI-VITA 1.1-1997).

Design Specification Rules/Tables:
    Rule 3.19 (ANSI-VITA 1.1-1997);
    Rule 3.21 (ANSI-VITA 1.1-1997);
    Rule 3.22 (ANSI-VITA 1.1-1997);
    Rule 3.26 (ANSI-VITA 1.1-1997); and
    FIGS. 5-7 at 70C (ANSI-VITA 1-1994).

While these ANSI-VITA Rules, Tables, Figures and/or Specifications may be preferable, it should be understood that any other appropriate, well-known standards and/or specifications could be used as well. In addition, the Power Supply Block 18 may provide a regulated voltage to the BT 1 and 100, which could be used to compensate for sources that are not providing power within a specified range. As a non-limiting example, the Power Supply Block 18 may be supplied with input power between about 3Vdc and 20Vdc and still be able to provide a regulated source of power to the onboard circuitry without damaging the BT 1 and 100.

Intrusive Voltage Switch and Attenuation Block 22: There is a possibility that faults can cause inappropriate (i.e., intrusive) voltage conditions on a backplane (and/or on any other testable device or system of interest), which could cause damage to card lines and/or to other components, and which could deleteriously affect the BT 1 and 100. Moreover, besides possibly being affected by intrusive voltages in general, the BT 1 and 100 may be used to test for (and/or detect) the presence of inappropriate voltages on bussed and/or daisy-chained signals, which may require the BT 1 and 100 to be designed to be capable of withstanding relatively high voltages. More specifically, the Intrusive Voltage Switch and Attenuation Block 22 (and the associated Intrusive Voltage Test 60) may be used to verify that no bused SERA/B (and/or daisy-chained) line and/or signal has an intrusive voltage applied. Moreover, as a non-limiting example, the Intrusive Voltage Test 60 could be designed to detect voltages outside the termination voltage range of the signal lines, and to be able to detect any daisy-chained or SERA/B line voltage. There are various methods that can be used to provide this functionality, as an example, but not as a limitation, the BT 1 and 100 could use analog circuitry to monitor signals from the backplane in order to verify proper voltages are present, and could include at least one analog multiplexer (that could be controlled by an FPGA, a similar "system on a chip," and/or some other suitable component, or digital controller) to pass a "single" signal from any backplane line into a "test circuit." This "test circuit" may use a zener-diode based circuit or other voltage reducing (or attenuation) method that could allow the Process and Display Block 32 to determine the original voltage for test and display purposes, and at least one ADC circuit (and/or some other circuit, component, and/or device) that could be used to check and/or assist in checking the detected voltage on each single tested line to determine if it passes the Intrusive Voltage Test 60 (i.e., the detected voltage is within a set specification value). (However, while the foregoing may be preferable methods of implementing these functions, other well-known methods could also be used.) Upon detecting an intrusive voltage, and/or after completing the Intrusive Voltage Test 60, indications of failures could be shown on at least the Display 110 and testing could be terminated. On the other hand, if a termination voltage is detected on a daisy-chained line, or if the backplane/system is de-energized and the appropriate test is selected, the testing may continue with another test (and, in this current example of an embodiment of the BT 1 and 100, if Test B is selected the test sequence would continue with the Short Test 68).

Multiplexer Block 14: In general, the Multiplexer Block 14 is used to reduce circuitry by providing the ability to share signal paths for each of the tests. More specifically, the Multiplexer Block 14 may be directed by the Control Block 28 to transmit the appropriate signals to at least the A/D Converter Block 30 for further processing. Furthermore, the Multiplexer Block 14 may also be directed by the Control Block 28 to apply positive pulses, negative pulses (e.g., by momentarily grounding a signal), or loads, to a signal under test.

A/D Converter Block 30: In general, since the A/D Converter(s) provide the link by which the analog signals are able to be processed digitally by an FPGA (a similar "system on a chip," and/or some other suitable component, or digital controller), the A/D Converter(s) are essential to the operation of the BT 1 and 100. At least one A/D Converter may be used in order to process both positive and negative voltages, low and high voltages, and to process the various voltage ranges that the BT 1 and 100 may be used to test. The Control Block 28 may be used to instruct which A/D Converter would be used to perform a signal measurement, and which could pass the digital representation of the signal to the Process and Display Block 32.

Process and Display Block 32: Preferably, all of the data from at least the A/D Converter Block 30 is passed to the Process and Display Block 32. Once the data is received, the Process and Display Block 32, which may contain at least one FPGA (or other suitable component, and/or digital controller) applies the necessary pass/fail criteria for each of the tests. For the Power Supply Test 52, the digital representation of the voltage is preferably received and compared against the specified (or appropriate) set value (i.e., the programmed or calibrated specification value), which preferably may be changed by performing a reprogramming or recalibrating procedure. The results of this comparison are then stored in RAM or Flash, and may be recalled at the end of testing and displayed on at least the Display 110. Likewise, for the Intrusive Voltage Test 60, a digital representation of the voltage on each signal line is provided from the A/D Converter Block 30. Preferably, all voltages are verified to be within normal operating range during the Intrusive Voltage Test 60, and, if they are not, testing could be terminated at the end of the Intrusive Voltage Test 60 in order to possibly remove the problem voltage before damage occurs. Should an intrusive voltage occur and be detected, the magnitude of the measured voltage may be stored in RAM or Flash and displayed at the end of the Intrusive Voltage Test 60 on at least the Display 110. Similarly, because a short between lines/components/signals can cause data corruption, as well as possibly cause a card malfunction, which could result in damage to one or more of the cards, the Short Test 68 may be used on the BT 1 and 100 to possibly verify that no short exists between any of the bussed signals (and/or between lines and/or components). Preferably, to implement this, the Control Block 28 may be used to drive a single signal-line with either a high pulse or low pulse, and the A/D Converter Block 30 is instructed by the Control Block 28 to measure all the other lines—one at a time—to determine that this pulse did not appear on the other lines. The Process and Display Block 32 is informed by the Control Block 28 which type of pulse reading it should receive from the A/D Converter Block 30 and thus be able to process the information and implement the proper pass/fail criteria. Should a short occur, the pin assignments of the shorted signals is preferably stored in RAM or Flash and displayed at the end of the test on at least the Display 110. Similarly, the Open Test 72, which may be used to verify that signals have connectivity to the backplane and that the backplane has correct terminations, produces results that are preferably processed in the Process and Display Block 32. In some of the embodiments of the BT 1 and 100, the Open Test 72 may be limited to only testing signals that have been terminated with termination networks (as stated in Rule 6.23a, ANSI-VITA 1-1994 and Rule 3.30, ANSI-VITA 1.1-1997), and/or to test the backplane for proper termination resistances. As a non-limiting example, an embodiment of the BT 1 and 100 may be provided with at least one voltage divider circuit, which may be utilized to determine backplane signal continuity and proper termination resistance (impedance); however, any other suitable method could be used as well. Furthermore, the Open Test 72 may be capable of monitoring signals that are pulled-up to a digital-logic high (approximately 3.5Vdc to 5.0Vdc) in order to verify connectivity. Preferably, the at least one FPGA (or other like or suitable component, and/or digital controller) used in the Process and Display Block 32 is used to retrieve and process the digital representation(s) of the voltages that are on the signal lines. Generally, such processing may include the use of a pre-programmed algorithm to determine (and then possibly indicate) whether an open or partially failed termination on one or more bused line has been detected. Should a failure occur and be detected, the pin assignments and type of open/termination failure will preferably be stored in RAM or Flash, and possibly displayed on the Display 110 at the end of the test. Lastly, the DC Impedance Test 74 will preferably be used to detect improper resistances (or impedances), which may affect the proper functioning of the backplane/system and may be caused by a variety of factors including, but not limited to: the corrosion of connectors; bent pins; and/or debris that may be interfering with a proper electrical (or physical) connection. Improper termination networks may also result in low or high resistance on a signal-line, causing signal distortion. Therefore, the Process and Display Block 32 (and/or the associated DC Impedance Test 74) may be used to test (or verify) that the bused signals have proper termination resistance(s). In implementation (and/or operationally), the DC Impedance Test 74 may be similar to the Open Test 72, but a more precise analysis of the termination voltage would be made to determine if signal integrity is compromised. Preferably, the Process and Display Block 32 performs this more precise analysis by averaging Open Test 72 loaded and unloaded voltages and applying limits that are just slightly above the average to determine whether or not potential faults exist. As with the other tests, any failure detected (and possibly all of the results obtained) by the DC Impedance Test 74 will be stored in RAM or Flash and displayed at the end of the test on at least the Display 110. Moreover, an embodiment of the BT 1 and 100 may be configured to test for and/or monitor "signaling impedance." Signaling impedance is a resistive characteristic generally associated with the high frequency transmission of data and/or other signals. Moreover, embodiments of the BT 1 and 100 may be provided with compensation in order to ameliorate deleterious measurement effects brought about by various interactions between the circuitry and/or other components of the BT 1 and 100 including, but not limited to, those effects caused by "signaling impedance."

Control Block 28: Preferably, the functions of the Control Block 28 will oversee the timing of and the control over all of the Blocks and Tests. These functions may be implemented by using at least one FPGA (some other "system on a chip," digital controller, or other suitable component and/or device). The Control Block 28 may be used to drive and monitor the lines being tested, and be used to functionally and operationally control the Intrusive Voltage Switching and Attenuation Block 22, each multiplexer, each A/D converter, and the Process and Display Block 32. The Control Block 28 also may provide any necessary signal interfacing with the backplane(s), which, as an example, may be necessary as long as an intrusive voltage protection is in place. Furthermore, the sequencing of the Tests may be controlled by the Control Block 28. As a non-limiting example, the operation of the Dead System 1 Test 64 may be linked to the performance of an analysis of the results of both the Power Supply Test 52 (e.g., by determining that no power is applied) and the Intrusive Voltage Test 60 (e.g., by determining that all bused signals are below about 500 mVdc). Preferably, but not as a limitation, the following ANSI-VITA Permissions, Rules and/or Figures may be used in implementing the functions of the Control Block 28:

Permissions, Rules and Figures:
Permission 6.3 (ANSI-VITA 1-1994);
Rule 6.23a (ANSI-VITA 1-1994);
FIG. 6-2 (ANSI-VITA 1-1994);
Rule 3.30 (ANSI-VITA 1.1-1997); and
FIG. 3-1 (ANSI-VITA 1.1-1997).

Design Specification Rules/Tables:
Rule 6.7 (ANSI-VITA 1-1994);
Rule 6.13 (ANSI-VITA 1-1994);
Rule 6.14 (ANSI-VITA 1-1994);
Rule 6.15 (ANSI-VITA 1-1994);
Rule 6.16 (ANSI-VITA 1-1994);
Rule 6.17 (ANSI-VITA 1-1994);
Rule 6.18 (ANSI-VITA 1-1994);
Rule 6.19 (ANSI-VITA 1-1994);
Rule 6.20 (ANSI-VITA 1-1994);
Rule 6.21 (ANSI-VITA 1-1994);
Rule 6.22 (ANSI-VITA 1-1994);
Rule 7.7 (ANSI-VITA 1-1994);
Rule 7.8 (ANSI-VITA 1-1994);
Rule 7.9 (ANSI-VITA 1-1994);
Rule 7.37 (ANSI-VITA 1-1994);
Rule 7.10 (ANSI-VITA 1-1994);
Rule 7.11 (ANSI-VITA 1-1994);
Rule 7.13 (ANSI-VITA 1-1994);
Rule 7.14 (ANSI-VITA 1-1994);
Rule 7.15 (ANSI-VITA 1-1994);
Rule 7.39 (ANSI-VITA 1-1994);
Rule 7.41 (ANSI-VITA 1-1994);
Rule 7.16 (ANSI-VITA 1-1994);
Rule 7.17 (ANSI-VITA 1-1994); and
Rule 7.18 (ANSI-VITA 1-1994).

While these ANSI-VITA Permissions, Rules and Figures may be preferable, it should be understood that any other appropriate, well-known standards and/or specifications could be used, as well.

Finally, it will be apparent to those skilled in the art of electronic testing equipment design (and/or other related fields) that many other modifications and/or substitutions can be made to the foregoing preferred embodiments without departing from the spirit and scope of the present invention. The preferred embodiments and the best mode of the present invention are described herein. However, it should be understood that the best mode for carrying out the invention herein described is by way of illustration and not by way of limitation. Therefore, it is intended that the scope of the present invention include all of the modifications that incorporate its principal design features.

What is claimed is:

1. A test device for use in testing a backplane, said test device comprising:
   a card form factor;
   a testing means, operationally attached to said card form factor, wherein said backplane has at least one slot and said card form factor being capable of being operationally inserted into said at least one slot,
   wherein said testing means comprises:
   a power supply test means for measuring the magnitude of at least one power supply voltage;
   a card detection means for determining if said at least one backplane slot is being used by devices that are in electrical communication with said test device or other backplane devices;
   a backplane bus locking means for providing an electrical signal to said backplane, said electrical signal adapted for dedicating said backplane to said test device during testing;
   an intrusive voltage test means for measuring backplane voltages and for terminating testing of said backplane when the magnitude of any of said backplane voltages exceeds a predetermined value;
   a short test means for determining whether any measured short-circuit conditions exist on said backplane;
   an open test means for determining whether any measured open-circuit conditions exist on said backplane and for measuring the network termination resistance of said backplane;
   an impedance test means for measuring the electrical resistance of transmission lines on said backplane; and
   at least one means for displaying information.

2. The test device as recited in claim 1, further comprising a means for controlling the operation of said testing means.

3. The test device as recited in claim 2, wherein said controlling means comprises at least one digital controller device.

4. The test device as recited in claim 1, wherein said at least one means for displaying information comprises at least one LED.

5. The test device as recited in claim 1, wherein said at least one means for displaying information comprises at least one LCD.

6. The test device as recited in claim 1, wherein said at least one means for displaying information comprises at least one Alpha-Numeric LED.

7. A test device for use in testing a backplane, said test device comprising:
   a card form factor; and
   a testing means, operationally attached to said card form factor, wherein said backplane has at least one slot and said card form factor being capable of being operationally inserted into at least one of said at least one slot, wherein said testing means comprises:
      a control component, in electrical communication with said backplane when said card form factor is inserted into said at least one of said at least one slot, said control component being able to control the operation of said testing means and capable of forming and transmitting at least one control signal;
      a power supply test component, in electrical communication with said control component, capable of measuring the magnitude of at least one power supply voltage in electrical communication with said power supply test component, and capable of forming and transmitting at least one power-supply-test result signal;
      a backplane bus locking component, in electrical communication with said control component, capable of providing at least one electrical locking signal, for enabling said backplane to be dedicated to said test device during testing, and capable of forming and transmitting at least one bus-locked-status signal;
      an intrusive voltage test component, in electrical communication with said control component, capable of measuring at least one backplane voltage, capable of terminating testing of said backplane by said test device when the magnitude of at least one of said at least one backplane voltage exceeds a predetermined value, and capable of forming and transmitting at least one intrusive-voltage-test result signal;
      a short test component, in electrical communication with said control component, capable of measuring electrical resistance and determining whether a short-circuit condition exists on said backplane, and capable of forming and transmitting at least one short-test result signal;
      an open test component, in electrical communication with said control component, capable of determining whether improper termination resistance conditions exist on said backplane, and capable of forming and transmitting at least one open-test result signal;
      an impedance test component, in electrical communication with said control component, capable of measuring the electrical resistance of at least one signal transmission line on said backplane, and capable of forming and transmitting at least one impedance-test result signal; and
      at least one means for displaying information in electrical communication with said control component.

8. The test device as recited in claim 7, wherein each said improper termination resistance is characterized by a measured electrical resistance value being higher than a predetermined electrical resistance reference value.

9. The test device as recited in claim 7, wherein each said improper termination resistance is determined by connecting said backplane to a voltage source through a termination network and receiving an electrical signal from said backplane and comparing said electrical signal with a predetermined improper termination resistance reference value.

10. The test device as recited in claim 7, wherein each said short-circuit condition is characterized by a measured voltage value being about equal to a predetermined short-circuit condition reference value.

11. The test device as recited in claim 7, wherein each said short-circuit condition is determined by driving the voltage level on each test line low and checking each monitored line for corresponding voltage fluctuations.

12. The test device as recited in claim 7, wherein each said short-circuit condition is determined by driving the voltage level on each test line high and checking each monitored line for corresponding voltage fluctuations.

13. The test device as recited in claim 7, wherein said at least one means for displaying information receives and processes at least one of: said at least one control signal; said at least one power-supply-test result signal; said at least one bus-locked-status signal; said at least one intrusive-voltage test result signal; said at least one short-test result signal; said at least one open-test result signal; and said at least one impedance-test result signal.

14. The test device as recited in claim 7, wherein said at least one information displaying means comprises:
   a. at least one LCD; and
   b. at least one LED.

15. The test device as recited in claim 14, further comprising an Alpha Numeric LED.

* * * * *

UNITED STATES PATENT AND TRADEMARK OFFICE
CERTIFICATE OF CORRECTION

PATENT NO. : 7,616,004 B1  Page 1 of 1
APPLICATION NO. : 10/975126
DATED : November 10, 2009
INVENTOR(S) : Schofield, III et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1085 days.

Signed and Sealed this

Nineteenth Day of October, 2010

David J. Kappos
*Director of the United States Patent and Trademark Office*